US010424553B2

(12) United States Patent
Yeruva et al.

(10) Patent No.: US 10,424,553 B2
(45) Date of Patent: Sep. 24, 2019

(54) SEMICONDUCTOR DEVICES WITH UNDERFILL CONTROL FEATURES, AND ASSOCIATED SYSTEMS AND METHODS

(71) Applicant: Micron Technology, Inc., Boise, ID (US)

(72) Inventors: Suresh Yeruva, Boise, ID (US); Kyle K. Kirby, Eagle, ID (US); Owen R. Fay, Meridian, ID (US); Sameer S. Vadhavkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 15/339,693

(22) Filed: Oct. 31, 2016

(65) Prior Publication Data

US 2018/0122762 A1    May 3, 2018

(51) Int. Cl.
*H01L 23/00* (2006.01)
*H01L 23/24* (2006.01)
(Continued)

(52) U.S. Cl.
CPC ............ *H01L 24/14* (2013.01); *H01L 21/563* (2013.01); *H01L 23/24* (2013.01); *H01L 24/16* (2013.01); *H01L 24/17* (2013.01); *H01L 24/29* (2013.01); *H01L 24/30* (2013.01); *H01L 24/73* (2013.01); *H01L 24/81* (2013.01); *H01L 23/3171* (2013.01); *H01L 2224/13021* (2013.01); *H01L 2224/1403* (2013.01); *H01L 2224/16237* (2013.01); *H01L 2224/171* (2013.01); *H01L 2224/17519* (2013.01); *H01L 2224/29028* (2013.01); *H01L 2224/29035* (2013.01); *H01L 2224/29036* (2013.01); *H01L 2224/29082* (2013.01); *H01L 2224/3003* (2013.01);
(Continued)

(58) Field of Classification Search
CPC ........ H01L 24/14; H01L 21/563; H01L 23/24
See application file for complete search history.

(56) References Cited

U.S. PATENT DOCUMENTS 4,859,269 A     8/1989  Nishiguchi
4,990,051 A     2/1991  Safabakhsh et al.
(Continued)

*Primary Examiner* — Errol V Fernandes
(74) *Attorney, Agent, or Firm* — Perkins Coie LLP

(57) ABSTRACT

Semiconductor devices with underfill control features, and associated systems and methods. A representative system includes a substrate having a substrate surface and a cavity in the substrate surface, and a semiconductor device having a device surface facing toward the substrate surface. The semiconductor device further includes at least one circuit element electrically coupled to a conductive structure. The conductive structure is electrically connected to the substrate, and the semiconductor device further has a non-conductive material positioned adjacent the conductive structure and aligned with the cavity of the substrate. An underfill material is positioned between the substrate and the semiconductor device. In other embodiments, in addition to or in lieu of the con-conductive material, a first conductive structure is connected within the cavity, and a second conductive structure connected outside the cavity. The first conductive structure extends away from the device surface a greater distance than does the second conductive structure.

24 Claims, 6 Drawing Sheets

(51) Int. Cl.
*H01L 21/56* (2006.01)
*H01L 23/31* (2006.01)

(52) U.S. Cl.
CPC .......... *H01L 2224/30177* (2013.01); *H01L 2224/73104* (2013.01); *H01L 2224/73204* (2013.01); *H01L 2224/81139* (2013.01)

(56) References Cited

U.S. PATENT DOCUMENTS

| | | |
|---|---|---|
| 5,169,196 A | 12/1992 | Safabakhsh |
| 5,589,029 A | 12/1996 | Matsui et al. |
| 6,201,306 B1 | 3/2001 | Kurosawa et al. |
| 6,513,796 B2 | 2/2003 | Leidy et al. |
| 6,774,011 B2 | 8/2004 | Nakazawa et al. |
| 7,470,120 B2 | 12/2008 | Cheung |
| 7,665,204 B2 | 2/2010 | Cheung et al. |
| 7,757,742 B2 | 7/2010 | Cheung et al. |
| 8,142,611 B2 | 3/2012 | Shibata et al. |
| 8,470,130 B2 | 6/2013 | Chong et al. |
| 9,530,751 B2 | 12/2016 | Nakano et al. |
| 2002/0019074 A1 | 2/2002 | Nakazawa et al. |
| 2002/0069952 A1 | 6/2002 | Kurosawa |
| 2009/0288858 A1* | 11/2009 | Fan ..................... H05K 1/111 174/250 |
| 2011/0140287 A1* | 6/2011 | Bathan .............. H01L 23/49838 257/784 |
| 2015/0214090 A1 | 7/2015 | Jin et al. |
| 2018/0374788 A1* | 12/2018 | Nakagawa ........ H01L 23/49827 |

\* cited by examiner

SEMICONDUCTOR DEVICES WITH UNDERFILL CONTROL FEATURES, AND ASSOCIATED SYSTEMS AND METHODS

TECHNICAL FIELD

The present technology is directed generally to semiconductor devices with underfill control features, and associated systems and methods.

BACKGROUND

Packaged semiconductor dies, including memory chips, microprocessor chips, and imager chips, typically include a semiconductor die, mounted on a substrate and (optionally) encased in a plastic protective covering. The die includes functional features, such as memory cells, processor circuits, and/or imager devices, as well as bond pads electrically connected to these functional features. The bond pads can be electrically connected to outside terminals to allow the die to communicate with other devices, e.g., higher level circuitry.

Semiconductor die packages typically include an underfill material between the die and the substrate. The underfill material prevents moisture and other foreign matter from entering the space between the die and the substrate, and can also aid in adhering the die to the substrate. A conventional process for attaching a die to a substrate is shown in FIGS. 1A and 1B. Beginning with FIG. 1A, a conventional die 11 includes downwardly-extending conductive pillars 16 to provide electrical and thermal connections with a corresponding substrate 30. The substrate 30 can include a cavity 34 positioned to facilitate densely packed electrically conductive connections to the pillars 16. Accordingly, the substrate 30 can include first bond pads 33a within the cavity 34 and second bond pads 33b outside the cavity 34. An underfill material 40 is applied to the underside of the die before the die 11 is connected to the substrate 30.

Referring next FIG. 1B, the die 11 and the substrate 30 are brought together. Individual pillars 16 are connected to corresponding first bond pads 33a or second bond pads 33b. During a reflow process, electrical and/or thermal connections are formed between the bond pads and the pillars, and the underfill material is distributed in the region between the die 11 and the substrate 30. The process typically includes applying pressure to the substrate 30 and/or the die 11 to fill the cavity 34 with the underfill material 40. Despite this approach, voids 42 can form in the cavity 34, which compromises the integrity of the sealing function performed by the underfill material 40. In addition, excess underfill material 41 typically squeezes out around the edges of the die 11, which can interfere with subsequent manufacturing processes, including placing other dies adjacent to or on top of the die shown in FIG. 1B.

DETAILED DESCRIPTION

Specific details of several embodiments of semiconductor devices having underfill control features, and associated systems and methods, are described below. In several embodiments described below, the semiconductor devices can include conductive structures (e.g., pillars) having different heights or lengths. This arrangement can complement the varying profile of a substrate that includes a cavity in which corresponding conductive bond pads are positioned. In other embodiments, the semiconductor device can include a non-conductive material positioned to at least partially occupy the cavity when the semiconductor device and the substrate are attached to each other, again to account for the varying profile of the substrate. And in still further embodiments, the foregoing techniques can be combined, e.g., in the form of a semiconductor device that includes both conductive structures having different heights or lengths, and a non-conductive material that projects into the substrate cavity. In any of these embodiments the drawbacks caused by excess underfill material can be reduced or eliminated, as will be described in further detail below.

The term "semiconductor device" generally refers to a solid state device that includes one or more semiconductor materials. A semiconductor device can include, for example, a wafer or a die that is singulated from a wafer. Throughout the present disclosure, semiconductor devices are generally described in the context of semiconductor dies; however, semiconductor devices are not limited to semiconductor dies.

The term "semiconductor device assembly" generally refers to an arrangement with one or more semiconductor devices incorporated into a common assembly, for example, a common package. The package can include a substrate and, in particular embodiments, a housing or casing that partially or completely encapsulates at least one semiconductor device. In some instances, the terms "lateral", "upper" and/or "lower" may be used to refer to relative directions or positions of features of the semiconductor devices and assemblies, in view of the orientations shown in the Figures. These terms, however, should be construed broadly to include devices having other orientations, such as inverted or inclined orientations, or orientations for which top/bottom, over/under, above/below, up/down and/or left/right can be interchanged.

Figure 2A:
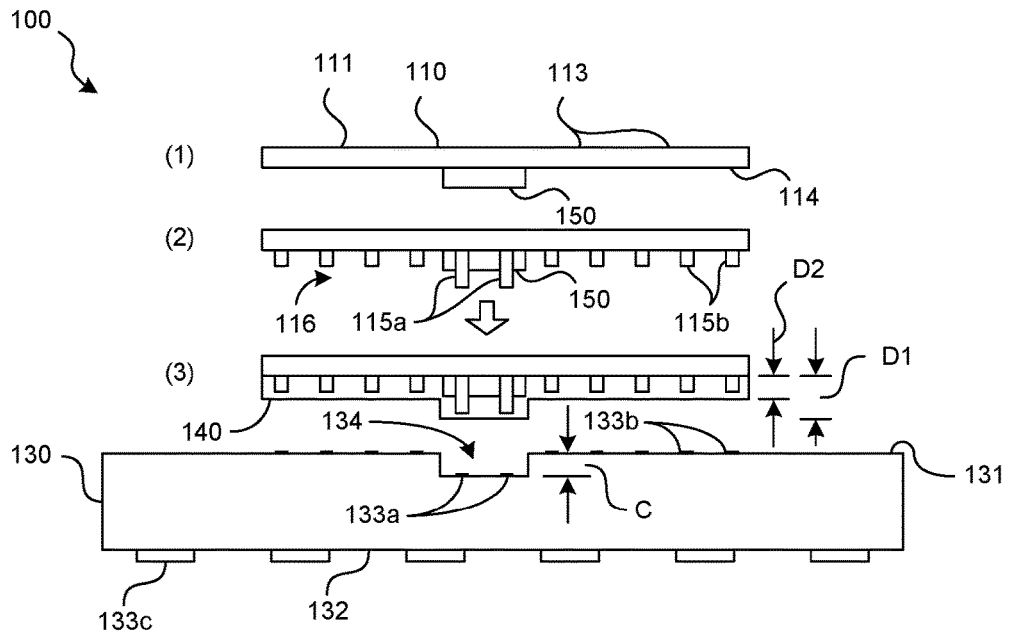
FIGS. 2A and 2B are partially schematic illustrations of a process for forming an assembly having a semiconductor device and a substrate in accordance with an embodiment of the present technology.
Figure 2B:
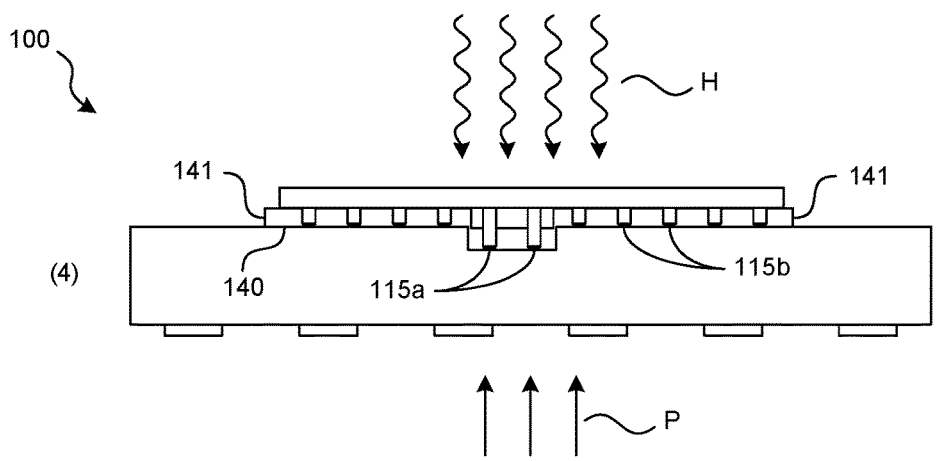

FIGS. 2A-2B illustrate a representative semiconductor device assembly 100, including representative components and elements of the assembly, and representative steps or portions of a process for forming the assembly. The semiconductor device assembly 100 can include a semiconductor device 110 and a substrate 130. For purposes of illustration, four representative process portions or manufacturing steps are identified in FIGS. 2A and 2B by reference numbers (1), (2), (3), and (4).

Beginning with FIG. 2A, process portion (1) can include producing or obtaining the semiconductor device 110. The semiconductor device 110 can carry or contain one or more semiconductor circuit elements 113, and can have a downwardly-facing device surface 114. As shown in FIG. 2A, the semiconductor device 110 can include a die 111 in which the semiconductor circuit element or elements 113 are positioned. A non-conductive material 150 has been applied to the device surface 114, using any of a variety of suitable techniques, for example, subtractive and/or additive patterning techniques. The non-conductive material 150 can include a passivation material or another suitable material that is electrically non-conductive.

Process portion (2) can include applying conductive structures 115 (shown in FIG. 2A as first conductive structures 115a and second conductive structures 115b) to the semiconductor device 110. The first conductive structures 115a can be electrically conductive, and can be positioned proximate to (e.g., adjacent to) the non-conductive material 150. The first conductive structures 115a can be used to transmit electrical signals to and/or from the corresponding substrate 130. The second conductive structures 115b can, in particular embodiments, be configured to transmit thermal energy, but not electrical energy, between the semiconductor device 110 and the substrate 130. Accordingly, while the second conductive structures 115b may be both thermally and electrically conductive, the thermally conductive properties are more significant, and the second conductive structures 115b may not provide a path for electrical signals between the semiconductor device 110 and the substrate 130. In particular embodiments, the first and/or second conductive structures 115a, 115b can include pillars, e.g., copper pillars, and in other embodiments, can include other suitable components.

Process portion (3) includes disposing an underfill material 140 between the semiconductor device 110 and the substrate 130 (e.g., on the device surface 114 of the semiconductor device 110). In particular embodiments, the underfill material 140 can be disposed in the form of a thin, one-piece sheet or film, before or after the conductive structures 115a, 115b are formed. In a particular aspect of this embodiment, the underfill material 140 stretches and/or otherwise deforms over structures projecting from the device surface 114. Accordingly, the underfill material 140 may be thinner over the conductive structures 115 then elsewhere, or the conductive structures 115 may extend through the underfill material 140 (as shown in FIG. 2A). In other embodiments, the underfill material can be disposed on the device surface 114 in accordance with other suitable techniques, including via a capillary process and/or an additive and/or subtractive deposition process. In any of these embodiments, suitable underfill materials are available from Hitachi Chemical Co. America, Ltd. of San Jose, Calif. or Toray Engineering Co. Ltd. of Tokyo, Japan.

The first conductive structures 115a extend away from the device surface 114 by a first distance D1, and the second conductive structures 115b extend away from the device surface 114 a second distance D2, which is less than D1. The difference between the first and second distances D1, D2 increases the uniformity with which the underfill material 140 is distributed in the region between the semiconductor device 110 and the substrate 130. In addition, the presence of the non-conductive material 150 causes the underfill material 140 to have a stepped profile, which is complementary to the stepped profile of the substrate 130, described further below.

The substrate 130 can include a substrate surface 131 facing upwardly toward the downwardly-facing device surface 114 of the semiconductor device 110. A cavity 134 in the substrate surface 131 has a cavity depth C and can have an elongated trench shape, extending into and/or out of the plane of FIG. 2A. The presence of the cavity 134 produces a stepped profile which is at least approximately matched by the complementary profile produced by the non-conductive material 150 at the device surface 114 of the semiconductor device 110. The substrate 130 can also include multiple bond pads 133, illustrated as first bond pads 133a within the cavity 134, second bond pads 133b external to the cavity 134, and third bond pads 133c positioned at a second (e.g., downwardly-facing) surface 132 of the substrate 130. The substrate 130 and the semiconductor device 110 are aligned relative to each other (e.g., moved) such that the non-conductive material 150 is aligned laterally with the cavity 134. In this position, the first bond pads 133a are aligned with the first conductive structures 115a carried by the semiconductor device 110, and the second bond pads 133b are aligned with the second conductive structures 115b of the semiconductor device 110. The first bond pads 133a are connected to internal conductive vias, lines, and/or other structures that route electrical signals between the first bond pads 133a and the third bond pads 133c. The third bond pads 133c have a greater pitch and/or size than the first bond pads 133a, to facilitate connecting the assembly 100 to other circuit elements.

FIG. 2B illustrates a further process portion (4) in which the semiconductor device 110 is attached to the substrate 130. As the semiconductor device 110 and the substrate 130 are brought into contact with each other, the non-conductive material 150 may or may not extend into the cavity 134, depending on the thickness of the non-conductive material 150 relative to the thickness of the underfill material 140. In either case, the non-conductive material 150 may be sized and positioned so as not to extend outwardly laterally beyond the extent of the cavity 134. During the attachment process, heat H and/or pressure P are applied to the assembly 100 to facilitate (a) robust electrical connections between the first conductive structures 115a and the first bond pads 133a, (b) robust thermal connections between the second conductive structures 115b and the second bond pads 133b, and (c) partial or complete reflow of the underfill material 140. During this process, the underfill material 140 tends to flow outwardly away from the conductive structures 115, so as not to interfere with the conductive bond between the conductive structures 115 and the substrate 130. As a result of the reflow process, the space between the semiconductor device 110 and the substrate 130 is filled, and (optionally) the physical connection between the semiconductor device 110 and the substrate 130 is strengthened. During this process, a small amount of the underfill material 140 may be squeezed out around the edges of the semiconductor device 110 to form excess material 141, but in general, the amount of the underfill material 140 that squeezes out is less than it is for conventional processes, e.g., as a result of the sizes of the conductive structures 115. In addition, the thickness of the underfill material 140 after process portion (4) is approximately the same both inside and outside the cavity 134.

Once the semiconductor device 110 and the substrate 130 are joined, the conductive structures 115 can include components from both the semiconductor device 110 and the substrate 130. For example, the first conductive structure 115a can include a pillar carried by the semiconductor device 110, and a second bond pad 133b carried by the substrate 130.

Figure 1A:
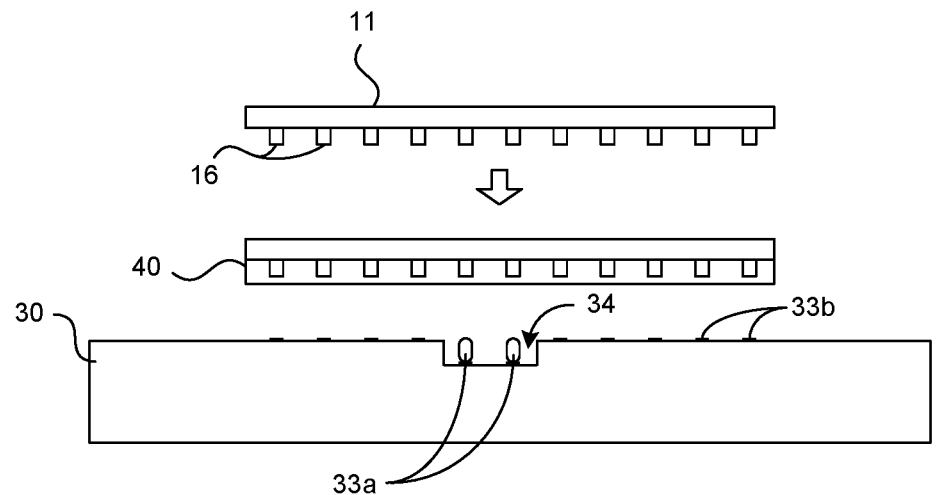
FIGS. 1A and 1B illustrate a process for assembling a die and substrate in accordance with the prior art.
Figure 1B:
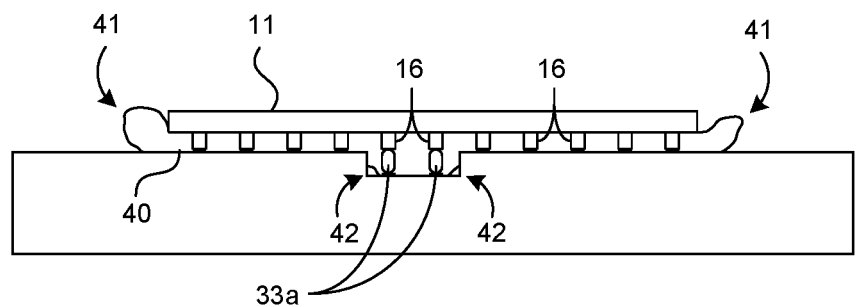

The features and processes described above with reference to FIGS. 2A and 2B can produce one or more results and advantages when compared with conventional techniques such as those described above with reference to FIGS. 1A-1B. For example, comparing FIG. 2B with FIG. 1B, the arrangement shown in FIG. 2B is expected to produce no voids 42 of the type shown in FIG. 1B, or at least a reduced number of such defects. In addition to or in lieu of an improvement in the number of voids, the amount of excess underfill material 141 shown in FIG. 2B is significantly reduced when compared to the amount of excess underfill material 41 shown in FIG. 1B. The foregoing results can produce corresponding advantages. For example, assemblies having fewer voids are less likely to suffer from defects caused by moisture and/or other foreign substances entering the region between the semiconductor device 110 and the substrate 130, thus reducing the likelihood for reduced device performance or failure. The reduced amount of excess underfill material can allow multiple semiconductor devices 110 to be stacked, one upon the other, on a single substrate, without interference. In other embodiments, the reduced excess material can allow multiple assemblies to be placed together, side by side or otherwise in a lateral direction, without interference caused by excess underfill material.

The advantages described above can be directly attributable to the presence of the non-conductive material 150, and/or the differences between the first and second conductive structures 115a, 115b. In particular, the non-conductive material 150 can occupy volume in and/or above the cavity 134 that would otherwise need to be occupied by forcing underfill material 140 into the cavity 134, for example, by placing the semiconductor device 110 and/or the substrate 130 under additional pressure. Accordingly, the non-conductive material 150 can reduce the force required to fill the cavity 134, and/or reduce the number of voids in the cavity 134. The difference in lengths of the first and second conductive structures can similarly provide for uniform contact forces at both the first bond pads 133a and the second bond pads 133b, despite the vertically offset positions of these bond pads. As a result of one or both of the foregoing features, the uniformly thick underfill material 140 can uniformly seal the region between the semiconductor device 110 and the substrate 130, without requiring that some of the underfill material 140 be forced into the cavity 134 from outside the cavity 134.

Figure 2C:
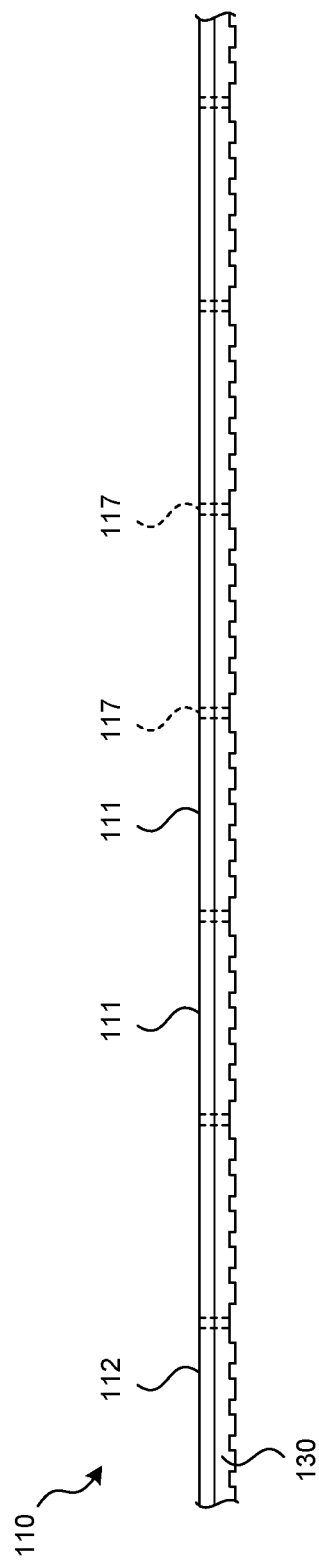
FIG. 2C illustrates a semiconductor device that includes a wafer having multiple die attached to a substrate, in accordance with an embodiment of the present technology.

In an embodiment described above with reference to FIGS. 2A and 2B, the semiconductor device 110 includes a single die 111. In other embodiments, similar techniques can be used to bond other semiconductor devices to corresponding substrates. For example, as shown in FIG. 2C, a representative semiconductor device 110 can include a wafer 112, which in turn includes multiple, unsingulated die 111. After the wafer 112 is bonded to the substrate 130, the multiple die 111 can be singulated by making cuts along corresponding dicing streets 117 between adjacent die 111. Each die 111 can include non-conductive material and conductive structures sized and positioned in generally the same manner as described above with reference to FIGS. 2A and 2B.

Figure 3A:
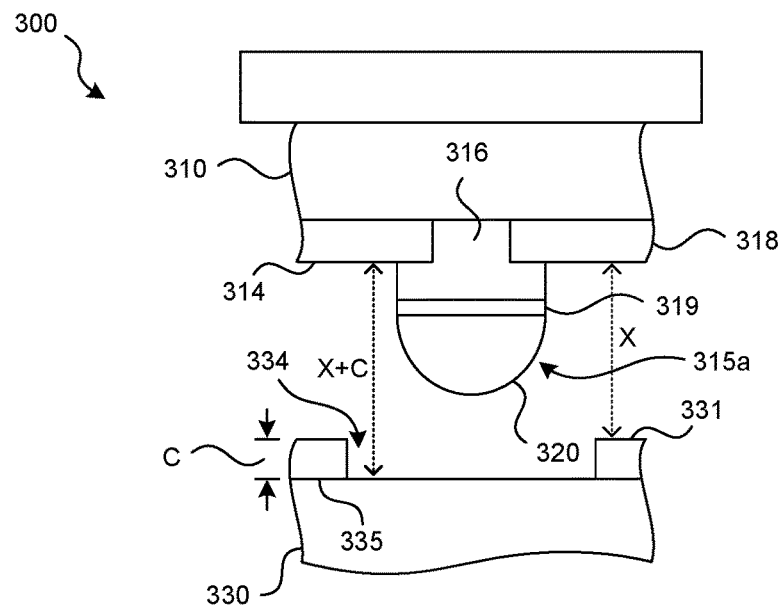
FIGS. 3A and 3B illustrate a representative process for disposing a non-conductive material adjacent to a conductive structure, in accordance with an embodiment of the present technology.
Figure 3B:
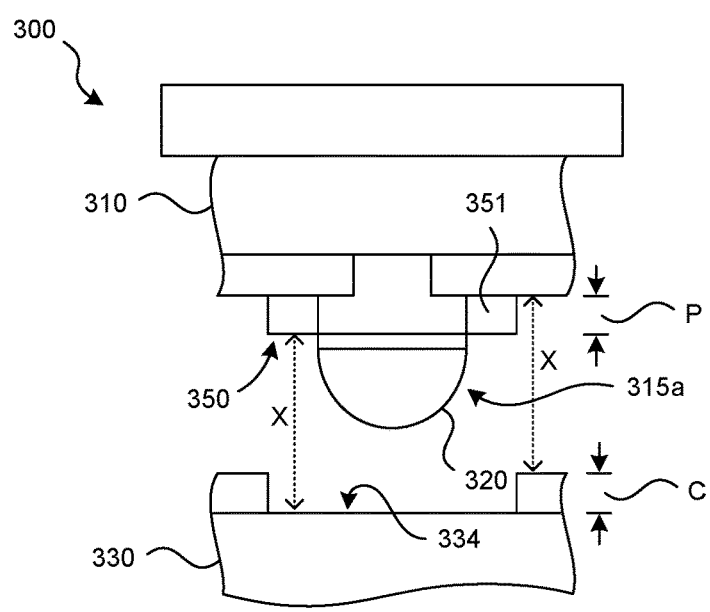

FIGS. 3A and 3B illustrate a semiconductor device assembly 300 and associated method of manufacture, in accordance with another embodiment of the present technology. FIG. 3A illustrates a portion of a representative semiconductor device 310 positioned proximate to a corresponding portion of a substrate 330, prior to bonding. The semiconductor device 310 can include a passivation layer 318, which forms a downwardly-facing device surface 314. A first conductive structure 315a is attached to the semiconductor device 310, and can include a pillar 316 (e.g., a copper pillar) that extends through a corresponding aperture in the passivation layer 318 to form an electrical connection with the internal circuitry of the semiconductor device 310. The pillar 316 can include a barrier layer 319 (e.g., a nickel barrier layer) and a volume of solder 320 positioned to make electrical contact with the substrate 330.

The substrate 330 can include a solder mask 335 which forms an upwardly-facing substrate surface 331. A cavity 334 is formed in the substrate 330 by an opening in the solder mask 335. Outside the cavity 334, the substrate surface 331 is separated from the device surface 314 by a distance X. Inside the cavity 334, the substrate surface 331 is separated from the device surface 314 by a distance X+C, where C corresponds to the depth of the cavity 334. To address this mismatch, a non-conductive material 350 is added to the semiconductor device 310, as shown in FIG. 3B. The non-conductive material 350 can have the form of a polymer ring 351 positioned around the pillar 316 and sized to fit within the cavity 334. The non-conductive material 350 can have a height or thickness P which is at least approximately the same as the depth C of the cavity 334. Accordingly, the distance X between the substrate surface 331 and the device surface 314 is the same (or approximately the same) both outside the cavity 334 and inside the cavity 334.

To bond the semiconductor device 310 to the substrate 330, an underfill material, e.g., a layer, similar to that shown and described above with reference to FIGS. 2A and 2B, is applied to the semiconductor device 310 prior to engaging the semiconductor device 310 with the substrate 330. As discussed above, a portion of the first conductive structure (in particular, the solder 320) can project through the underfill material, and/or the underfill material can flow away from the solder 320 during the reflow/connection process, to allow the solder 320 to bond with the substrate 330. The presence of the non-conductive material 350 can reduce and/or eliminate voids and excess underfill material, as described above with reference to FIG. 2B.

Figure 4A:
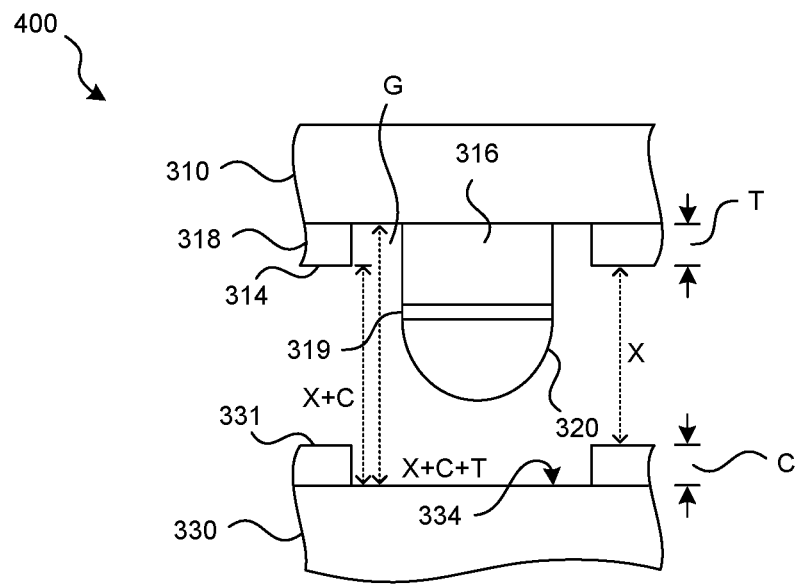
FIGS. 4A and 4B illustrate a representative process for disposing a non-conductive material adjacent to a conductive structure in accordance with another embodiment of the present technology.
Figure 4B:
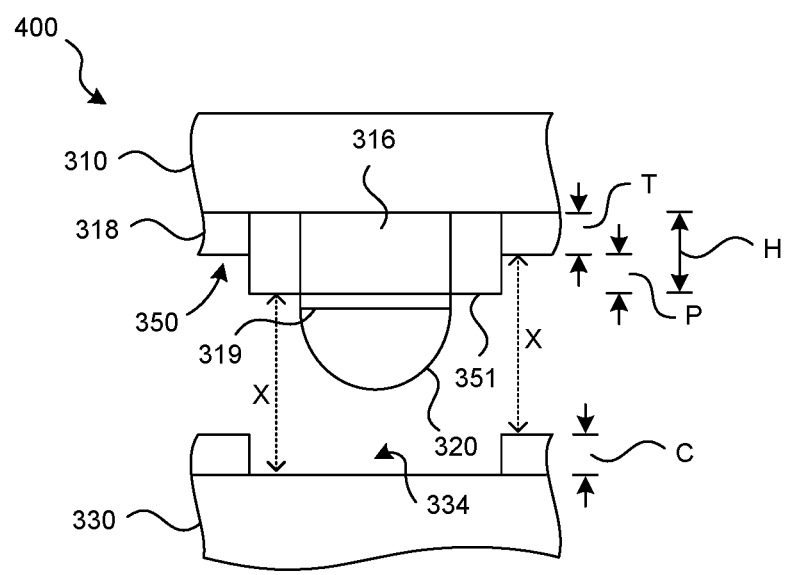

FIGS. 4A and 4B illustrate an assembly 400 configured in accordance with another representative embodiment of the present technology. In one aspect of this embodiment, the pillar 316 is separated laterally from the passivation layer 318 by a gap G. Accordingly, outside the cavity 334, the substrate surface 331 is separated from the device surface 314 by a distance X, while inside the cavity 334, the two surfaces are separated from each other by a distance X+C (the depth of the cavity 334)+T (the thickness of the passivation layer 318).

As shown in FIG. 4B, the corresponding non-conductive structure 350 can fill the gap G (FIG. 4A) so that the offset distance between the two surfaces 331, 314 is the same (X) both inside the cavity 334 and outside the cavity. The non-conductive material 350 can accordingly have an overall height H that includes both the distance P described above with reference to FIG. 3B (and approximately the same as the cavity depth C) and the thickness T of the passivation layer 318.

Figure 5:
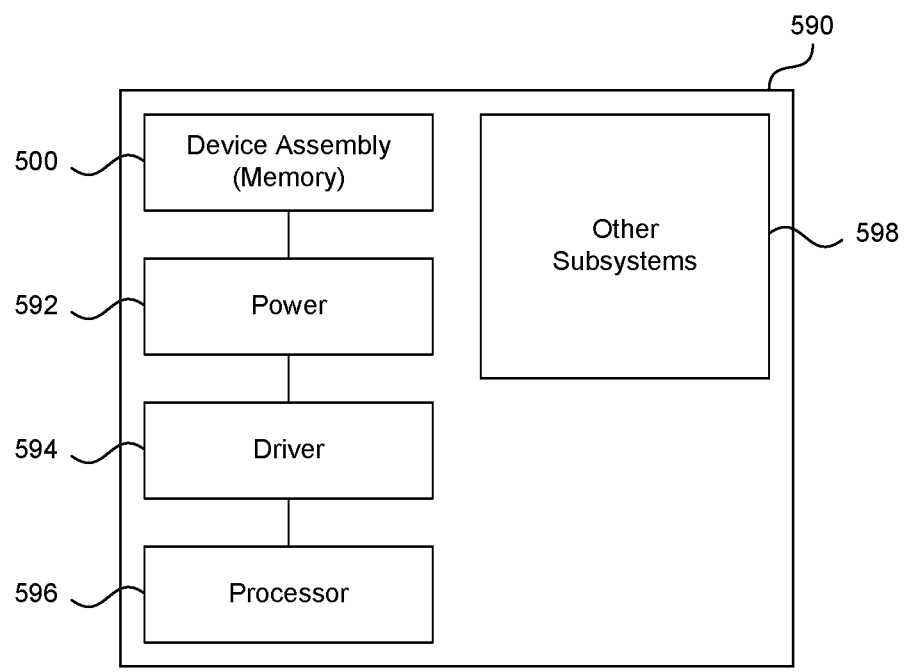
FIG. 5 is a schematic illustration of a system that can include one or more devices of the type shown in FIGS. 2A-4B, in accordance with an embodiment of the present technology.

Any one or combination of the semiconductor device assemblies described above with reference to FIGS. 2A-4B can be incorporated into any of a myriad of larger and/or more complex systems, a representative example of which is a system 590 shown schematically in FIG. 5. The system 590 can include a semiconductor device assembly 500, a power source 592, a driver 594, a processor 596, and/or other subsystems or components 598. For example, the other subsystems or components 598 can include a camera or other optical sensor. The semiconductor device assembly 500 can be a stand-alone assembly, or it can be incorporated into a larger element, e.g., a system memory element, power source 592, driver 594, processor 596 and/or other subsystems 598. Accordingly, the semiconductor device of the device assembly 500 can be electrically coupled to any of the elements shown in FIG. 5, e.g., the memory, power source and/or processor. The semiconductor device assembly 500 can include features generally similar to those of the semiconductor device assemblies described above with reference to FIGS. 2A-4B, and can therefore include various features that improve the performance of the underfill material by accounting for differences in the distances that initially separate the semiconductor device from its corresponding substrate. The resulting system 590 can perform any of a wide variety of functions, including memory storage, data processing, and/or other suitable functions. Accordingly, representative systems 590 can include, without limitation, hand-held devices (e.g., mobile phones, tablets, digital readers, and digital audio players), computers, vehicles, appliances and other products. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the present technology have been described herein for purposes of illustration, but that various modifications may be made without deviating from the technology. For example, the conductive structures and/or the non-conductive materials can include compositions, compounds, and/or other combinations of materials different than those expressly described above. In particular embodiments described above, the non-conductive material is applied to the semiconductor device, and in other embodiments, the non-conductive material can be applied to the substrate. The conductive structures can include pillars, or other suitable elements, e.g., in applications for which the tight pitch capabilities of pillars are not required.

Certain aspects of the technology described in the context of particular embodiments may be combined or eliminated in other embodiments. For example, in particular embodiments, the non-conductive material may be used independently of the conductive structures having different heights, and/or vice-versa, depending upon the embodiment. Further, while advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

We claim:

1. A semiconductor device assembly, comprising
a substrate having a substrate surface and a cavity in the substrate surface;
a semiconductor device having a device surface facing toward the substrate surface, the semiconductor device further having at least one circuit element electrically coupled to a conductive structure, wherein the conductive structure is electrically connected to the substrate, the semiconductor device further having a non-conductive material positioned adjacent the conductive structure and aligned with the cavity of the substrate; and
an underfill material positioned between the substrate and the semiconductor device, wherein
the cavity includes an elongated trench;
the conductive structure is one of multiple conductive structures, with individual conductive structures connected between the semiconductor device and corresponding locations in the cavity;
the multiple conductive structures include a first conductive structure connected to the substrate within the cavity, and a second conductive structure connected to the substrate outside the cavity;
the first conductive structure extends away from the device surface of the semiconductor device by a first distance; and
the second conductive structure extends away from the device surface of the semiconductor device by a second distance less than the first distance.

2. The system of claim 1 wherein the non-conductive material does not extend laterally outwardly beyond the cavity.

3. The system of claim 1 wherein a thickness of the non-conductive material and a depth of the cavity are at least approximately the same.

4. The system of claim 1 wherein the conductive structure includes an elongated pillar.

5. The system of claim 1 wherein the substrate includes a solder mask, and wherein the solder mask has an opening, and wherein the opening forms the cavity.

6. A semiconductor device assembly, comprising
a substrate having a substrate surface and a cavity in the substrate surface;
a semiconductor device having a device surface facing toward the substrate surface, the semiconductor device further having at least one semiconductor circuit element and a plurality of conductive structures, including a first conductive structure connected to the substrate within the cavity, and a second conductive structure connected to the substrate outside the cavity, wherein the first conductive structure extends away from the device surface of the semiconductor device by a first distance, and the second conductive structure extends away from the device surface of the semiconductor device by a second distance less than the first distance; and
an underfill material positioned between the substrate and the semiconductor device,
wherein the semiconductor device further includes a non-conductive material positioned adjacent the first conductive structure and aligned with the cavity of the substrate.

7. The system of claim 6 wherein the semiconductor device includes a diced die.

8. The system of claim 6 wherein the semiconductor device includes a wafer, and wherein the wafer includes a plurality of unsingulated die.

9. The system of claim 6 wherein the first conductive structure is electrically coupled to the circuit element to transmit electrical signals between the substrate and the semiconductor device.

10. The system of claim 6 wherein the second conductive structure is in thermal communication with the substrate.

11. The system of claim 10 wherein the second conductive structure is not electrically coupled to the circuit element.

12. The system of claim 6 wherein the underfill material includes a film.

13. The system of claim 6 wherein the underfill material includes a sheet.

14. The system of claim 6 wherein the first conductive structure includes a first component carried by the substrate and a second component carried by the semiconductor device.

15. The system of claim 14 wherein the first component includes a bond pad and wherein the second component includes a conductive pillar.

16. The system of claim 6, further comprising:
a memory;
a processor; and
a power source, and wherein the semiconductor device is electrically coupled to at least one of the memory, the processor or the power source.

17. The system of claim 16, further comprising an optical sensor, and wherein the semiconductor device is coupled to at least one of the memory, the processor, the power source or the optical sensor.

18. A semiconductor device assembly, comprising
a substrate having:
  a substrate surface and a cavity in the substrate surface;
a semiconductor device having:
  a device surface facing toward the substrate surface;
  at least one circuit element;
  a plurality of conductive structures, including a first conductive structure connected to the substrate in the cavity, and a second conductive structure connected to the substrate outside the cavity; and
a non-conductive material positioned adjacent the first conductive structure and aligned with the cavity of the substrate; and
wherein the first conductive structure extends away from the device surface by a first distance, and the second conductive structure extends away from the device surface by a second distance less than the first distance; and
an underfill material positioned between the substrate and the semiconductor device.

19. The system of claim 18 wherein the non-conductive material does not extend laterally outwardly beyond the cavity.

20. The system of claim 18 wherein the first conductive structure includes an elongated pillar.

21. The system of claim 18 wherein the substrate includes a solder mask, and wherein the solder mask has an opening, and wherein the opening forms the cavity.

22. The system of claim 18 wherein the first conductive structure is electrically coupled to the circuit element to transmit electrical signals between the substrate and the semiconductor device.

23. The system of claim 18 wherein the second conductive structure is in thermal communication with the substrate.

24. The system of claim 23 wherein the second conductive structure is not electrically coupled to the circuit element.

* * * * *